United States Patent [19]

McShane

[11] Patent Number: 5,041,902

[45] Date of Patent: Aug. 20, 1991

[54] MOLDED ELECTRONIC PACKAGE WITH COMPRESSION STRUCTURES

[75] Inventor: Michael B. McShane, Austin, Tex.

[73] Assignee: Motorola, Inc., Schaumburg, Ill.

[21] Appl. No.: 450,763

[22] Filed: Dec. 14, 1989

[51] Int. Cl.$^5$ ............................................. H01L 23/42
[52] U.S. Cl. ...................................... 357/79; 357/80; 357/81; 357/72; 357/70
[58] Field of Search ........................ 357/79, 80, 81, 72, 357/70

[56] References Cited

U.S. PATENT DOCUMENTS

| | | | |
|---|---|---|---|
| 3,786,317 | 1/1974 | Thierfelder | 357/72 |
| 4,012,765 | 10/1990 | Lehner et al. | 357/81 |
| 4,012,768 | 3/1977 | Kirk et al. | 357/72 |
| 4,415,025 | 11/1983 | Horvath | 367/386 |
| 4,630,172 | 12/1986 | Stenerson et al. | 361/386 |
| 4,698,663 | 10/1987 | Sugimoto et al. | 357/81 |
| 4,712,129 | 12/1987 | Orcutt | 357/84 |

FOREIGN PATENT DOCUMENTS 2456390 5/1980 France .

OTHER PUBLICATIONS

W. R. DeBoskey, "Directly Attached Integrated Circuit Lead Frame," *IBM Technical Disclosure Bulletin*, vol. 15, No. 1, Jun. 1972.

*Primary Examiner*—Eugene R. LaRoche
*Assistant Examiner*—R. Ratliff
*Attorney, Agent, or Firm*—Jasper W. Dockrey; John A. Fisher

[57] ABSTRACT

A molded package having reduced unintentional and undesirable mold flash or bleed around an exposed heat sink is provided through the use of a compression structure within the package. The compression structure may be integral with a heat sink, die bond flag, if one is present, or may be a separate structure, which extends from a die support surface of the heat sink to the opposite side of the mold. During molding, the compression structure presses a heat dissipation surface of the heat sink against the mold surface forming a tight seal to prevent the mold compound from creeping around between the mold and the heat dissipation surface to form flash. The heat sink may also be provided with adhesion promotion features along its side to improve the physical bond or attachment between the heat sink and the plastic body of the package.

2 Claims, 4 Drawing Sheets

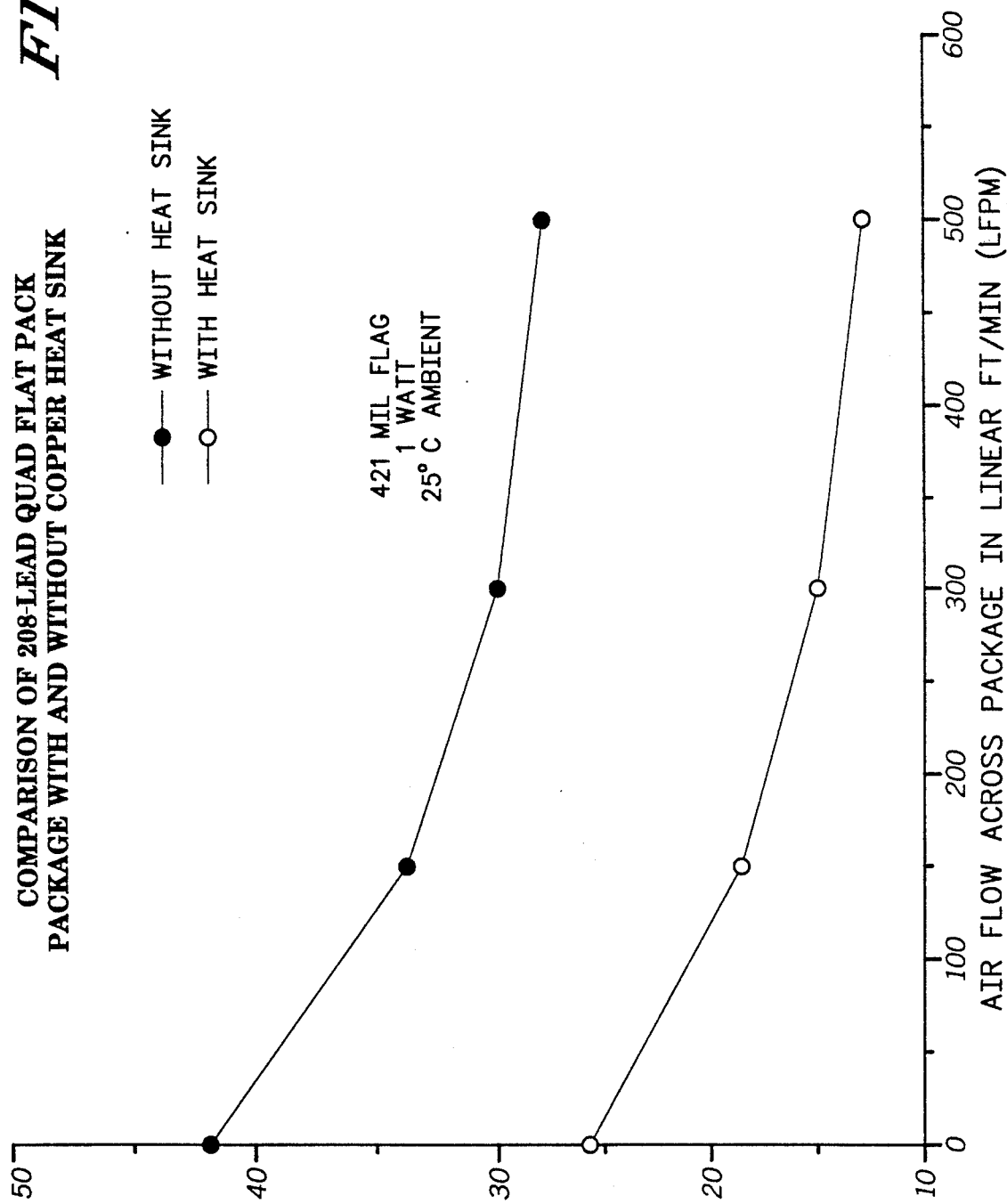

MOLDED ELECTRONIC PACKAGE WITH COMPRESSION STRUCTURES

FIELD OF THE INVENTION

The invention relates to packages for electronic devices, and, in one aspect, more particularly relates to packages and containers for electronic devices such as integrated circuits, for example, that are molded using thermoplastic and thermoset materials.

BACKGROUND OF THE INVENTION

It is well known that an increasingly important consideration in the production and use of integrated circuits (ICs) is the package in which the IC resides. The module or casing in which the IC is packaged is an important factor in the ultimate cost, performance and lifetime of the IC. For example, as ICs become more dense, dissipation of the thermal energy generated by them in an efficient manner becomes increasingly important in permitting their useful life to be as long as possible. Another consideration as the circuits become denser is that the number of leads to the package and connections from the leads to the integrated circuit pads increases; thus increasing the complexity of construction and adding to the cost of the end product, not just in terms of increased and more expensive materials, but also increased production costs. These considerations are aggravated with the requirements of power circuits, that is, those circuits which handle relatively large amounts of power. For example, higher speed "BiCMOS" memory devices are driving to higher power consumption—in excess of 0.8 W—relatively high for an integrated circuit. BiCMOS is an acronym standing for integrated circuits using both bipolar and complementary metal oxide semiconductor technology. Small outline, J-lead (SOJ)-type packages have lower inductance advantages, but because the package is smaller, the thermal energy dissipation capability is lower.

Another factor affecting the design of IC packages is the advent of surface mount technology, whereby space is conserved on the printed circuit boards (PCBs) by mounting the packages directly on the conductive patterns of the circuit board, rather than by extending the leads through holes in the board. This technology is an additional influence in making the packages smaller, and making it more difficult to design a small package that will dissipate thermal energy readily.

Thus, a continuing goal in the art of providing packages for electronic components such as integrated circuits is a package design that will address these multiple goals satisfactorily in an arrangement that can be reliably manufactured at the lowest cost. The lowest cost packages are those which have plastic bodies which can be molded from thermoplastic and thermoset materials. However, a difficulty in molding plastic packages containing heat sinks is that excess mold material or "flash" creeps around the heat sink. Obviously, at least one surface of the heat sink should remain exposed to provide the surface area for maximum heat transfer to the ambient. The presence of mold flash over this surface inhibits the desired heat transfer. Removing the mold flash from this face of the package can be time-consuming and difficult.

SUMMARY OF THE INVENTION

Accordingly, it is an object of the present invention to provide an integrated circuit package design that will dissipate thermal heat readily.

It is another object of the present invention to provide an IC package with improved thermal dissipation that can be readily and reliably manufactured.

It is yet another object of the invention to provide an integrated circuit package that may be injection or over-molded to provide a low-cost package with high thermal dissipation, but a minimum of heat-blocking flash or bleed of the mold material.

In carrying out these and other objects of the invention, there is provided, in one form, an electronic package having an integrated circuit die with a plurality of bonding pads thereon, and a heat sink having a die support surface upon which the integrated circuit die is mounted. The heat sink further has a heat dissipation surface opposite the die support surface. Also present are a plurality of package leads (typically, but not necessarily, part of a lead frame) having proximal ends electrically connected to the bonding pads of the integrated circuit die and distal ends extending outside the package. The package also has a package body of insulative material enclosing the integrated circuit die, and the proximal ends of the leads, but leaving at least part of the heat dissipation surface exposed. Additionally present is at least one compression structure extending from the heat sink to the side of the package opposite the heat dissipation surface. This compression structure places a force on the heat sink to "seal" the heat dissipation surface against the mold to reduce mold flash or creep around this surface during molding.

BRIEF DESCRIPTION OF THE DRAWINGS

FIG. 5 is a plot of thermal resistance as a function of air flow across plastic packages with and without a copper heat sink having a flat thermal dissipation surface that is exposed on one side of the package.

It will be appreciated that in some of the Figures the proportions of the various parts are not to scale. For example, the thicknesses of various components in both FIGS. 1 and 3 have been exaggerated for clarity.

DETAILED DESCRIPTION OF THE INVENTION

Figure 1:
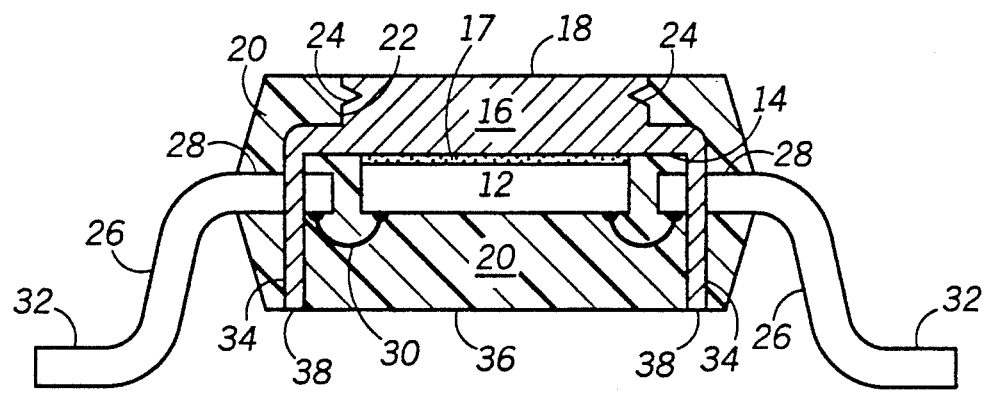
FIG. 1 is a cross-sectional, schematic view of an assembled electronic package of the present invention illustrating one version of the compression structure.

Shown in FIG. 1 is one embodiment of a molded electronic package 10 of the present invention having an integrated circuit die 12 which is mounted on the die support surface 14 of a heat sink 16 with a conventional or highly thermally conductive die bond adhesive 17, which may include solder, epoxy, etc. It will be appreciated that while the term "integrated circuit die" is used throughout this description, that the invention contemplates other electronic components besides integrated circuits, and considers them to be encompassed herein as well. On the other side of heat sink 16 from die support surface 14 is a heat dissipation surface 18, which is exposed and visible in package body 20 of package 10. Heat dissipation surface 18 may have a textured surface as depicted in the FIGS. 3a and 3b embodiment to further increase the heat dissipation therefrom. The textured surface may be any surface which has an increased surface area over what is the minimum area required to provide a flat heat dissipation surface 18.

The heat sink 16 may be further provided with at least one side surface 22 between die support surface 14 and heat dissipation surface 18 which may have an adhesion promoting feature 24 therein. Adhesion promoting feature 24 may be a groove, as depicted in FIG. 1, or may be of another form, such as a hole, corrugation, chemically or physically roughened surface, etc., which promotes adhesion of the package body 20 material to the heat sink. Such a feature 24 would help prevent separation of the package body 20 from heat sink 16 over time and cracks between the two generally dissimilar materials that might admit moisture and contribute to the degradation of the package 10 and encased die 12. Such separation and cracks may occur over time as the heat sink 16 and package body 20 expand and contract at different rates over the lifetime of the package 10. Thus, some sort of adhesion promotion feature 24 along the side 22 of the heat sink 16 to facilitate adhesion and bonding at this region is a valuable improvement.

Also shown in FIG. 1 are a plurality of package leads 26 which are typically, but not necessarily, part of a conventional lead frame. Package leads 26 have proximal ends 28 which may be electrically connected to the bonding pads (not shown) of integrated circuit die 12 by any conventional means, such as direct bonding, flip-chip bonding techniques, tape automated bonding (TAB), or wire bonds 30, or the like. In an optional alternative, proximal ends 28 may also be bonded to the heat sink 16 with a non-conductive adhesive (not shown). Distal ends 32 of leads 26 extend outside the package body 20 and may be formed into any of the conventional configurations for through-hole or surface mounting. Typical configurations for surface mounting include, but are not limited to, gull-wing (the one depicted in FIG. 1), butt joint, J-lead, etc.

Package body 20, which may be of any conventional or suitable thermoplastic or thermoset material encloses the integrated circuit die 12, the proximal ends 28 of leads 26 and the adhesion promotion feature 24, if present, of heat sink 16, but leaves exposed the heat dissipation surface 18 so that thermal energy may more readily leave therefrom. An important part of the present invention is the use of a compression structure, which may take many forms, such as compression columns 34 integral with the heat sink 16 as shown in the FIG. 1 embodiment. The compression columns 34 extend from the heat sink 16 to the side 36 (PCB, side) of the package 10 opposite the heat dissipation surface 18. During the molding operation, compression columns 34 press the heat dissipation surface 18 to its corresponding mold cavity surface forming a "seal" against the mold cavity face to inhibit the mold material from creeping around the heat dissipation surface 18 and forming undesirable mold flash. This force is provided by the closure of the mold itself against the outer ends 38 of the compression columns 34 which is transmitted across the package by columns 34. In design, the distance from the heat dissipation surface 18 to the end 38 of the columns 34 should be the exact width of the mold cavity, or slightly longer than that width to provide the proper compressive force.

During molding, compression columns 34 may be flexed or bent to a slight extent, which is permissible since their function is to provide force across the thickness dimension of the package. Too much deformation of the columns 34 may be disadvantageous. After the package is molded, cooled and removed from the mold, the force of the columns wanting to return to their original shape should not be so great as to undesirably deform the package 10 itself. However, some flexing of the columns 34 may be tolerated within the package 10 without detrimental effect to the ultimate package 10. Outer ends 38 of columns 34 will be exposed on side 36 without disadvantage, although they may help with the thermal dissipation to some extent, especially if columns 34 are integral with heat sink 16.

It is apparent that compression columns 34 may be any structure which can serve to transmit force across the thickness of the package 10 when the mold is closed during the molding operation. Additionally, the compression structures must avoid physical and electrical interference with the leads 26 and whatever bonds, such as wire bonds 30, are present. For this reason, compression columns 34 at one or more corners of the heat sink 16 are suitable, although other configurations and structures which may accomplish these goals are anticipated. The compression structure may be integral with a heat sink, as described above, integral with a die bond flag, as described below, or may be free from integration with any structure and may stand alone. In the case where the compression structure is a separate item, it may be placed on the heat sink, die bond flag, or other appropriate structure just prior to the molding step. Such free-standing structures may be held in place using a suitable adhesive.

Figure 2:
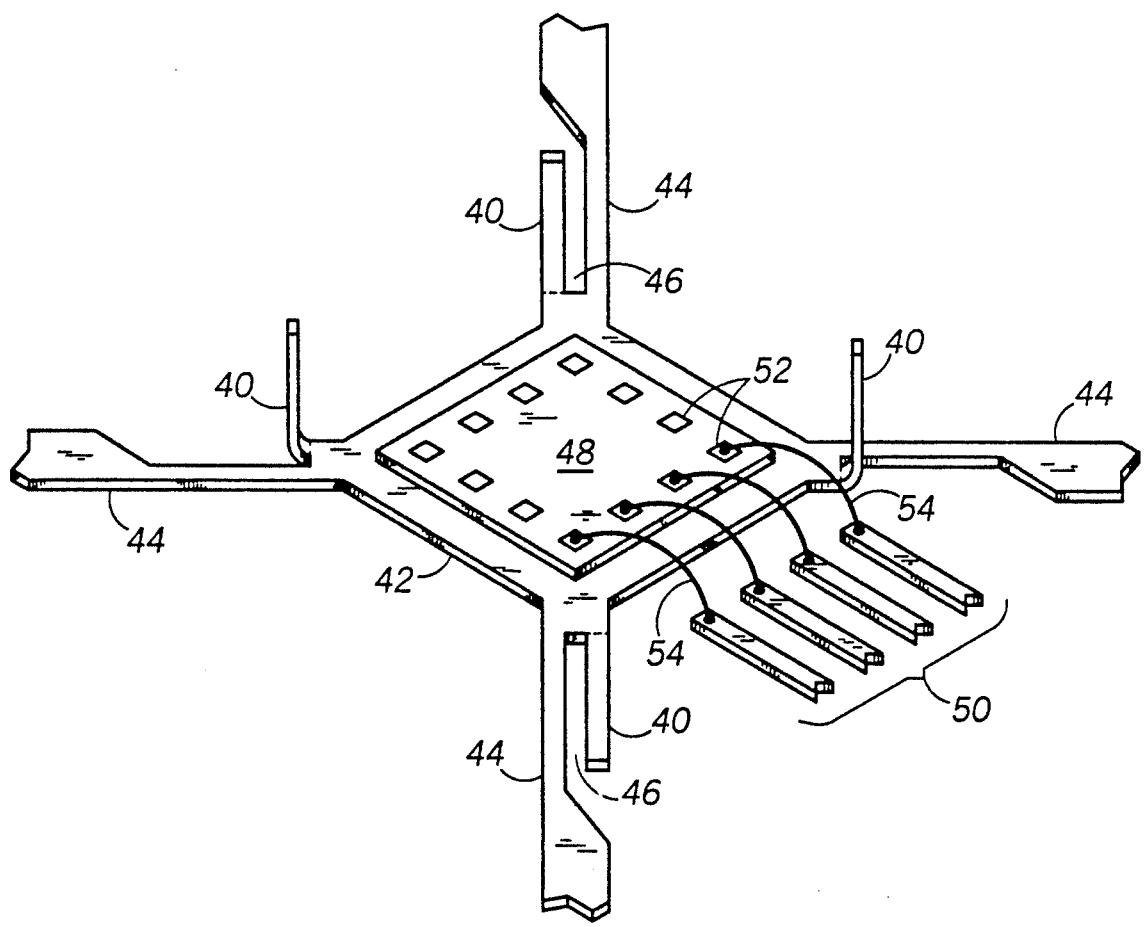
FIG. 2 is a partial, three-quarters view of a lead frame possessing another embodiment of the compression structures of the present invention in the process of being assembled into an electronic package.

Shown in FIG. 2 is another embodiment of the compression structure of this invention, where the compression structures are compression columns 40 that are integral with a die bond flag 42, which may or may not be derived from a lead frame. Die bond flag 42 has in this embodiment a plurality of tie bars 44 situated at the corners of the flag 42. The tie bars 44 have longitudinal slots 46 therein which define a column 40 (see nearest corner) that may be rotated approximately 90° relative to the plane of the die bond flag 42 (see columns on other three corners).

In this embodiment, the integrated circuit die 48 is not directly bonded to a heat sink, but rather is bonded to the die bond flag 42 in a conventional manner and leads 50 from a lead frame (not shown) are positioned in close proximity to the bonding pads 52 on the die 48 for bonding by conventional means, such as wire bonds 54. It is apparent that only a few pads 52 and leads 50 are shown for clarity, since it is well known that in actuality the number of pads and leads may be in the hundreds. The die bond flag 42 may be directly bonded to a heat sink such that effectively a package similar to the one illustrated in FIG. 1 is produced, except that the die bond flag 42 is intermediate to the die 48 and the heat sink 16, and the compression columns 40 on the die bond flag 42 are the structures that transfer the force to the heat sink for sealing and preventing flash during molding.

Figure 3A:
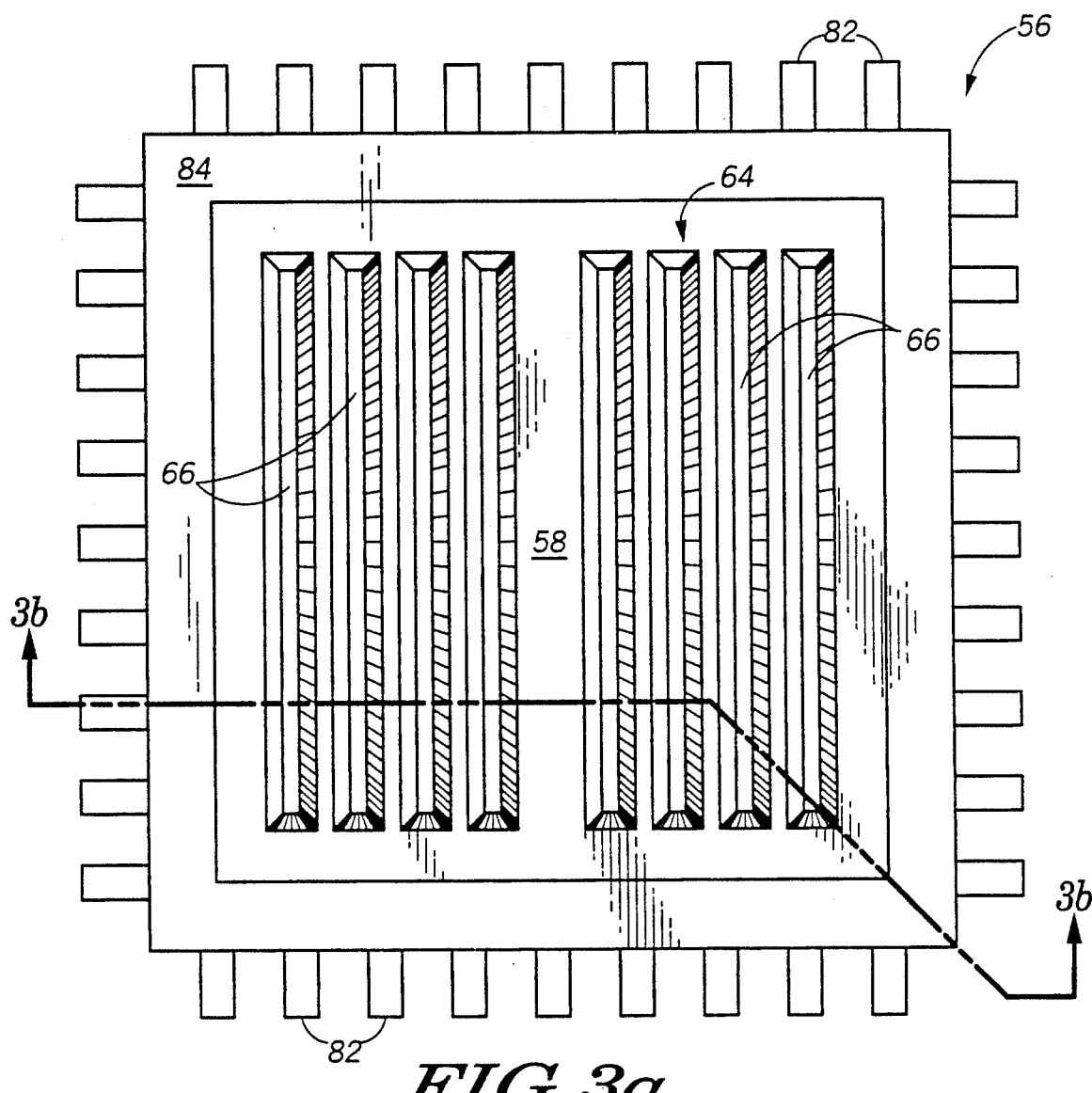
FIG. 3a is a top, plan view of another assembled IC package of the present invention employing a free-standing compression structure.
Figure 3B:
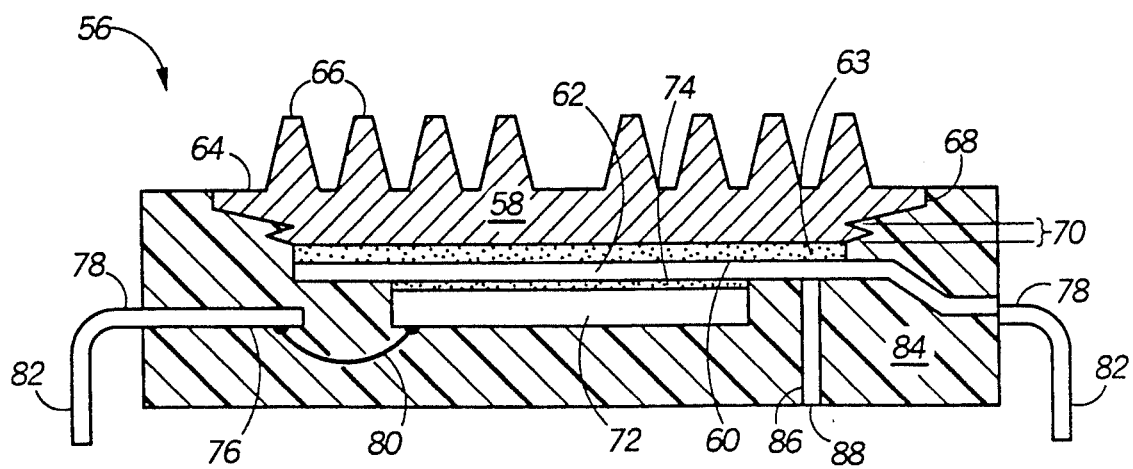
FIG. 3b is a cross-sectional, profile view of the IC package of FIG. 3a taken along line 3b—3b.

In FIG. 3a, another embodiment of the molded, electronic package 56 of the present invention is shown in plan view, illustrating a heat sink 58 with a heat dissipation surface 64 that has a plurality of fins 66 more descriptively seen in FIG. 3b. A plurality of distal lead ends 82 are also visible protruding from package body 84.

Shown in FIG. 3b is a partial, cross-sectional illustration of the embodiment of the present invention of FIG. 3a along line 3b—3b showing package 56 having a heat sink 58 with die support surface 60 having a die bond flag 62 mounted directly thereon using an adhesive 63 to insure good heat transfer. Such an adhesive 63 may be similar to conventional die attach adhesive. Opposite die support surface 60 is heat dissipation surface 64 bearing fins 66 which make up the bulk of the textured heat dissipation surface 64. Between die support surface 60 and heat dissipation surface 64 are side surfaces 68 with adhesion promotion features 70. Heat sink 58, as well as heat sink 16 in FIG. 1, may be made from any suitable material having a good heat transfer coefficient, including, but not limited to, copper, aluminum, iron, alloys thereof, highly thermally conductive ceramics, and the like, and combinations thereof. Heat sink 58 may also be a molded composite material, such as a filled plastic.

Integrated circuit die 72 is bonded to die bond flag 62 via die bond adhesive 74. Proximal ends 76 of leads 78 are bonded to die 72 via wire bonds 80, and distal ends 82 of leads 78 extend from package body 84 and are formed into a butt joint lead configuration suitable for surface mounting on a PCB or similar substrate. The package body 84 completely surrounds the die 72, proximal ends 76, wire bonds 80, die bond flag 62 (although tie bars, if present to support die bond flag 62 during assembly, may be optionally exposed), and the adhesion promotion features 70 of heat sink 58, leaving most, if not all, of the heat dissipation surface 64 with fins 66 exposed.

In this embodiment, compression structures 86 are not integral with the die bond flag 62, lead frame or heat sink 58, but instead are "free-standing" and placed on the die bond flag 62 just prior to molding. The partially assembled flag 62, leads 78, heat sink 58, etc. may actually be placed in the mold in an orientation inverted to that depicted in FIG. 3. After placement of compression structures 86, the mold is closed, and ends 88 of compression structures 86 touch one side of the mold cavity forcing the heat dissipation surface 64 against the opposite side of the mold cavity to form a tight seal inhibiting mold compound from creeping around to the heat dissipation surface and forming undesirable mold flash. Compression structures 86 may remain in place in the finished package without disadvantage.

Figure 4:
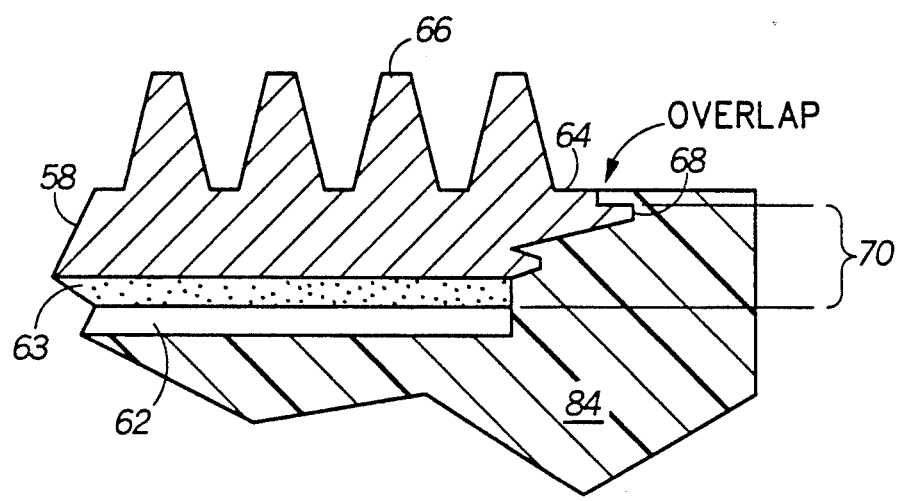
FIG. 4 is a cross-sectional, partial profile view of another heat sink design.

Compression structures 86 will provide sufficient force to reduce or eliminate mold flash even if the package body 84 overlaps the edge of the heat sink 58 as illustrated in FIG. 4, which details a section of a slightly altered embodiment from that shown in FIG. 3. This overlap would provide a more secure seal of the heat sink 58 within the package 56 and would be difficult to achieve without considerable undesirable flash in the absence of the compression structures 86. Obviously, side surface 68 of heat sink 58 may have different contours than those illustrated herein. However, it is expected that the use of compression structures will eliminate or reduce the incidence of mold flash regardless of the design of the heat sink.

Shown in FIG. 5 is a graph of the thermal resistance between the heat dissipation surface or junction and the ambient, defined as $\theta_{ja}$, as a function of the air flow across the junction in linear feet per minute (LFPM) for a 208-lead quad flat pack (QFP) package with and without a copper heat sink directly contacting the die. It may be seen that the use of the heat sink greatly lowers the thermal resistance at all air flows. These packages did not have adhesion promotion features nor compression structures, but they do illustrate the great advantage to using a heat sink coupled as closely as possible to the die.

In general, the procedure for making the molded electronic packages of the present invention involves attaching an integrated circuit die having bonding pads to a die support surface of a heat sink, where the heat sink additionally has a heat dissipation surface opposite the die support surface. It is within the scope of the method that a die bond flag may or may not be present in between the die and the die support surface of the heat sink. Proximal ends of leads of a lead frame are attached to the bonding pads of the integrated circuit die to form an intermediate assembly. At least one compression structure extending from the die support surface of the heat sink (or the die bond flag, if one is present) to above at least the integrated circuit die and the proximal ends of the lead frame is provided. As noted, the compression structure may be integral with the heat sink, the die bond flag, or may be a separate structure. The intermediate assembly is placed into a mold having a first opposing surface and a second opposing surface, where the heat dissipation surface is adjacent the first opposing surface, and where the compression structure extends between the die support surface of the heat sink and the second opposing surface of the mold. The mold is closed and an insulative compound, such as a suitable thermoset plastic, or similar material, is injected into the mold to encapsulate the integrated circuit die, and the proximal ends of the leads, but leaving at least part of the heat dissipation surface exposed. Finally, the mold is opened to remove the electronic package.

Thus, the structure and method of this invention provide a molded electronic component package with a heat sink that is more firmly anchored in the package due to the effect of the adhesion promotion features that more intimately physically interact the heat sink with the package body. Additionally, the use of compression structures greatly reduces or eliminates the presence of unintentional and unwanted flash on the exposed heat dissipation surfaces of the heat sink. Such flash tends to insulate the heat dissipation surface and blocks the effective dissipation of heat.

Many modifications may be made in the structure and process of the present invention without departing from the scope thereof. For example, the compression structures may be in the form of a cube, ring or other structure besides a column, and the adhesion promotion feature may be in the form of fingers or other shapes to increase the physical adhesion of the heat sink with the mold compound.

I claim:

1. An electronic package comprising:
   an integrated circuit die having a plurality of bonding pads thereon;
   a heat sink having:
   a die support surface upon which the integrated circuit die is mounted; and a heat dissipation surface opposite the die support surface; and a plurality of package leads having
proximal ends electrically connected to the bonding pads of the integrated circuit die; and
distal ends extending outside the package;

a package body of insulative material enclosing the integrated circuit die, and the proximal ends of the leads, but leaving at least part of the heat dissipation surface exposed; and at least one compression structure means extending from the heat sink to a side of the package opposite the heat dissipation surface for forcing the heat sink against a mold member during the formation of the package body wherein the compression structure means are not integral with either a die bond flag or the heat sink.

2. An electronic package comprising:

an integrated circuit die having a plurality of bonding pads thereon;

a heat sink having:

a die support surface upon which the integrated circuit die is mounted;

a heat dissipation surface opposite the die support surface; and at least one surface between the die support surface and the heat dissipation surface having adhesion promoting features thereon;

a plurality of package leads having
proximal ends electrically connected to the bonding pads of the integrated circuit die; and
distal ends extending outside the package;

a package body of insulative material enclosing the integrated circuit die, the proximal ends of the leads, and the adhesion promoting features, but leaving at least part of the heat dissipation surface exposed; and at least one compression structure means extending from the heat sink to a side of the package opposite the heat dissipation surface for forcing the heat sink against a mold member during the formation of the package body wherein the compression columns are not integral with either a die bond flag or the heat sink.

* * * * *